(12) United States Patent
Matano et al.

(10) Patent No.: US 9,078,351 B2
(45) Date of Patent: Jul. 7, 2015

(54) GROUNDING GASKET AND ELECTRONIC APPARATUS

(71) Applicant: KABUSHIKI KAISHA TOSHIBA, Minato-ku, Tokyo (JP)

(72) Inventors: Tomohiro Matano, Ome (JP); Motoyuki Hirakata, Fukaya (JP)

(73) Assignee: Kabushiki Kaisha Toshiba, Tokyo (JP)

(*) Notice: Subject to any disclaimer, the term of this patent is extended or adjusted under 35 U.S.C. 154(b) by 133 days.

(21) Appl. No.: 14/015,883

(22) Filed: Aug. 30, 2013

(65) Prior Publication Data

US 2014/0133116 A1    May 15, 2014

Related U.S. Application Data

(63) Continuation of application No. PCT/JP2013/068456, filed on Jun. 28, 2013.

(30) Foreign Application Priority Data

Nov. 15, 2012    (JP) .................................. 2012-251427

(51) Int. Cl.
   *H05K 1/02*    (2006.01)
   *H05K 9/00*    (2006.01)

(52) U.S. Cl.
   CPC ............ *H05K 1/0213* (2013.01); *H05K 9/0054* (2013.01); *H05K 9/006* (2013.01); *H05K 9/0015* (2013.01)

(58) Field of Classification Search
   CPC .... H05K 9/0015; H05K 9/006; H05K 9/0054
   USPC .......................................... 174/356, 369, 382
   See application file for complete search history.

(56) References Cited

U.S. PATENT DOCUMENTS

| | | | | |
|---|---|---|---|---|
| 3,140,342 A | * | 7/1964 | Avery et al. .................... | 174/356 |
| 5,045,635 A | * | 9/1991 | Kaplo et al. ................... | 174/354 |
| 5,070,216 A | * | 12/1991 | Thornton ....................... | 174/355 |
| 5,120,903 A | * | 6/1992 | Tam ............................... | 174/354 |
| 5,142,101 A | * | 8/1992 | Matsuzaki et al. ............. | 174/354 |
| 5,511,798 A | * | 4/1996 | Kawamoto et al. ........... | 277/647 |
| 5,522,602 A | * | 6/1996 | Kaplo et al. ................... | 277/650 |
| 6,255,581 B1 | | 7/2001 | Reis et al. | |

(Continued)

FOREIGN PATENT DOCUMENTS

| | | |
|---|---|---|
| JP | 08-210509 | 8/1996 |
| JP | 09-143453 | 6/1997 |

(Continued)

OTHER PUBLICATIONS

International Search Report and Written Opinion in International Application No. PCT/JP2013/068456 dated Oct. 1, 2013, in 10 pgs.

*Primary Examiner* — Hung V Ngo
(74) *Attorney, Agent, or Firm* — Knobbe, Martens, Olson & Bear, LLP

(57) ABSTRACT

According to one embodiment, a grounding gasket includes a main body and a projecting part. The main body is configured to be interposed between a ground part and a substrate and contact the ground part and the substrate. The projecting part projects from the main body. The projecting part is configured to extend through a through-hole which is opened in the substrate, project to a side opposite to a side on which the ground part is located, and contact a conductive component mounted on the substrate.

18 Claims, 11 Drawing Sheets

(56) References Cited

U.S. PATENT DOCUMENTS

| | | | |
|---|---|---|---|
| 6,308,961 | B1 | 10/2001 | Kunikane et al. |
| 6,613,976 | B1 | 9/2003 | Benn, Jr. |
| 6,667,435 | B1* | 12/2003 | French et al. ............ 174/369 |
| 2004/0216910 | A1* | 11/2004 | Reis et al. ............ 174/35 GC |
| 2009/0000818 | A1* | 1/2009 | Poulsen ................... 174/370 |
| 2009/0059550 | A1 | 3/2009 | Miyamura |
| 2009/0114438 | A1* | 5/2009 | van Haaster ............ 174/356 |
| 2011/0155445 | A1* | 6/2011 | Kwon et al. ............ 174/384 |
| 2012/0090886 | A1* | 4/2012 | Park et al. ............ 174/358 |

FOREIGN PATENT DOCUMENTS

| | | |
|---|---|---|
| JP | 2002-510873 | 4/2002 |
| JP | 2000-291802 | 10/2002 |
| JP | 2003-531483 | 10/2003 |
| JP | 2007-324333 | 12/2007 |
| JP | 2011-029266 | 2/2011 |
| WO | WO 2007/113993 | 10/2007 |
| WO | WO 2011/148656 | 12/2011 |

* cited by examiner

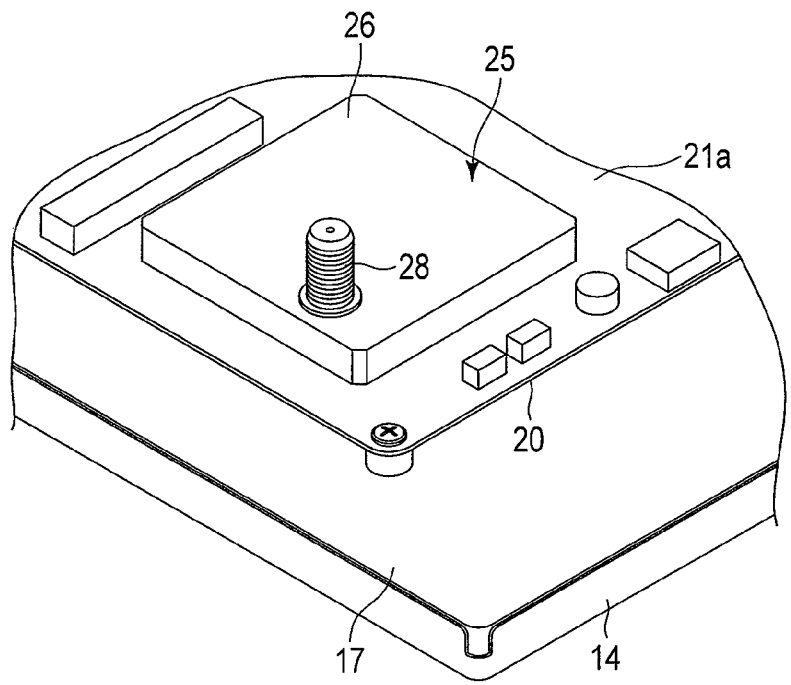
F I G. 4
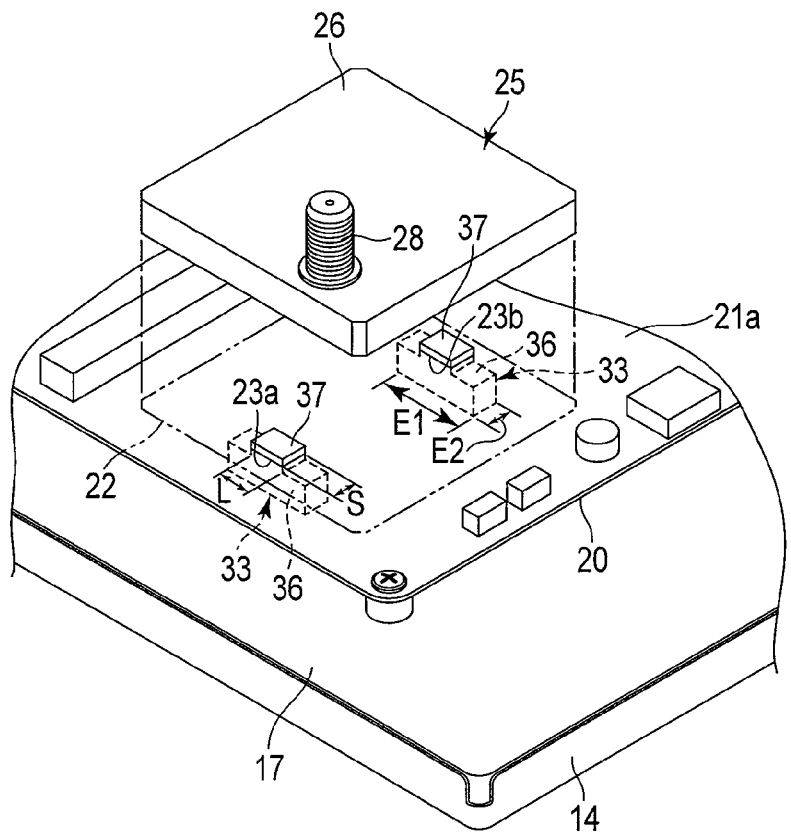
F I G. 5

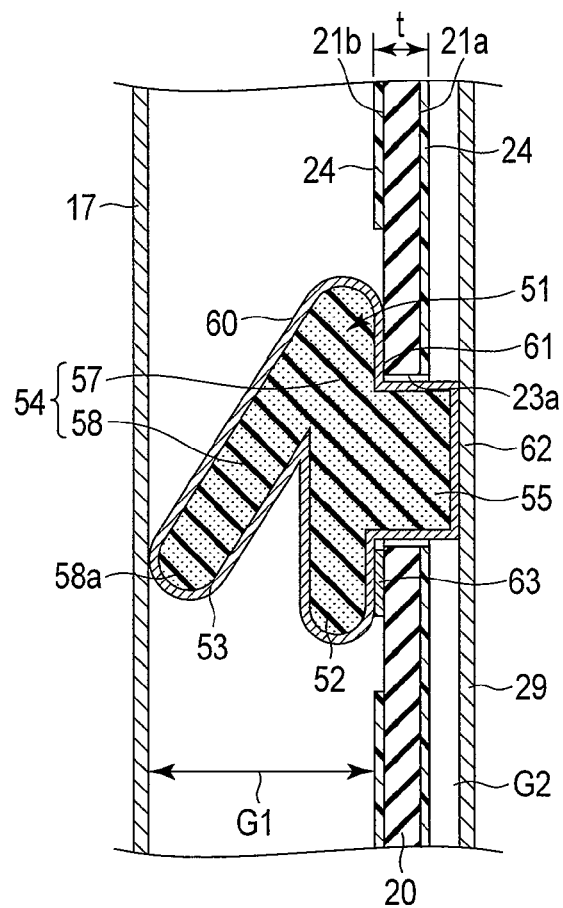
F I G. 12
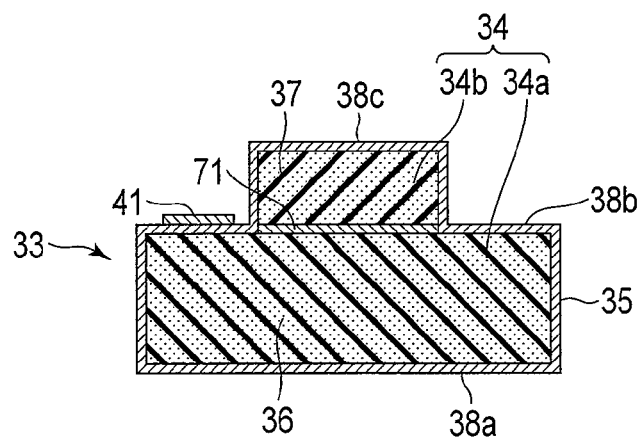
F I G. 13

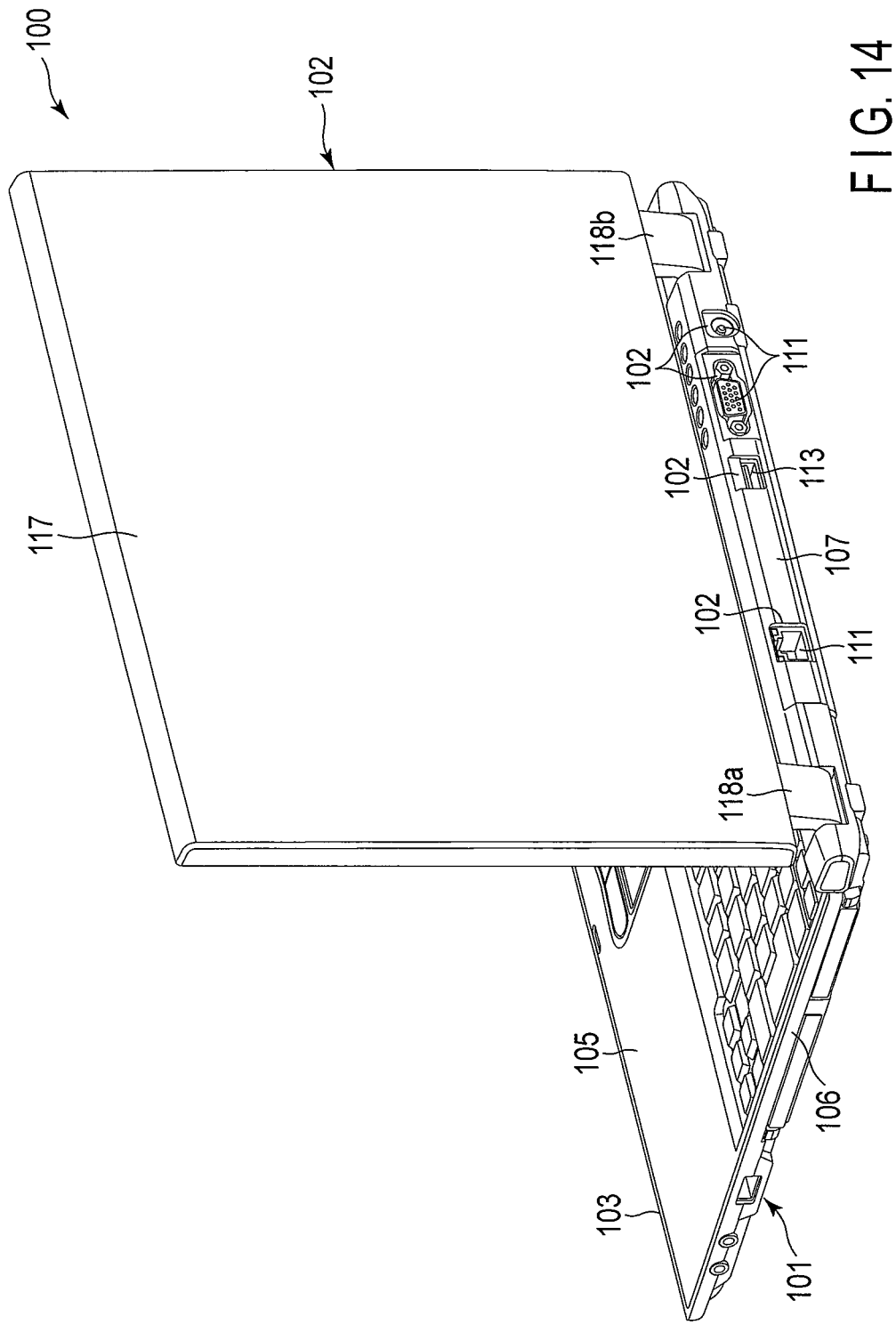
F I G. 14

GROUNDING GASKET AND ELECTRONIC APPARATUS

CROSS REFERENCE TO RELATED APPLICATIONS

This application is a Continuation Application of PCT Application No. PCT/JP2013/068456, filed Jun. 28, 2013 and based upon and claiming the benefit of priority from Japanese Patent Application No. 2012-251427, filed Nov. 15, 2012, the entire contents of all of which are incorporated herein by reference.

FIELD

Embodiments described herein relate generally to a grounding gasket for preventing, for example, radio interference and an electronic apparatus.

BACKGROUND

In electronic apparatuses such as televisions, a grounding gasket is interposed between a component which generates radio-frequency emissions and a grounding metal panel.

In prior art, when the component which causes radio interference is mounted on a substrate and the substrate is interposed between the component and the metal panel, a grounding gasket is interposed between the component and the substrate, and another grounding gasket is interposed between the substrate and the metal panel, in many cases.

In this case, however, since the substrate is interposed between the two grounding gaskets, the component, for which measures against radio interference are taken, cannot be directly electrically connected to the metal panel. In addition, there are no clear marks for determining the positions of the grounding gaskets. Therefore, the positions of the grounding gaskets with respect to the component and the metal panel may vary.

As a result, the original performance of the grounding gaskets cannot be fully exhibited, and there is room for improvement to securely solve radio interference.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 4 is an exemplary perspective view illustrating a state in which the tuner module is mounted on the TV substrate, in the first embodiment;

FIG. 5 is an exemplary perspective view illustrating a state in which a pair of grounding gaskets are interposed between the radiator plate and the TV substrate, in the first embodiment;

FIG. 12 an exemplary cross-sectional view illustrating a state in which the grounding gasket is interposed between the radiator plate and the tuner module, in the third embodiment;

FIG. 13 is an exemplary cross-sectional view of a grounding gasket used in a fourth embodiment;

FIG. 14 is an exemplary perspective view of a portable computer according to a fifth embodiment.

DETAILED DESCRIPTION

Various embodiments will be described hereinafter with reference to the accompanying drawings.

In general, according to one embodiment, a grounding gasket, which is formed by covering an outer peripheral surface of an elastic core member with a conductive layer, includes a main body and a projecting part. The main body is configured to be interposed between a ground part and a substrate and contact the ground part and the substrate. The projecting part projects from the main body. The projecting part is configured to extend through a through-hole which is opened in the substrate, project to a side opposite to a side on which the ground part is located, and contact a conductive component mounted on the substrate.

First Embodiment

A first embodiment will be explained hereinafter with reference to FIG. 1 to FIG. 7.

Figure 1:
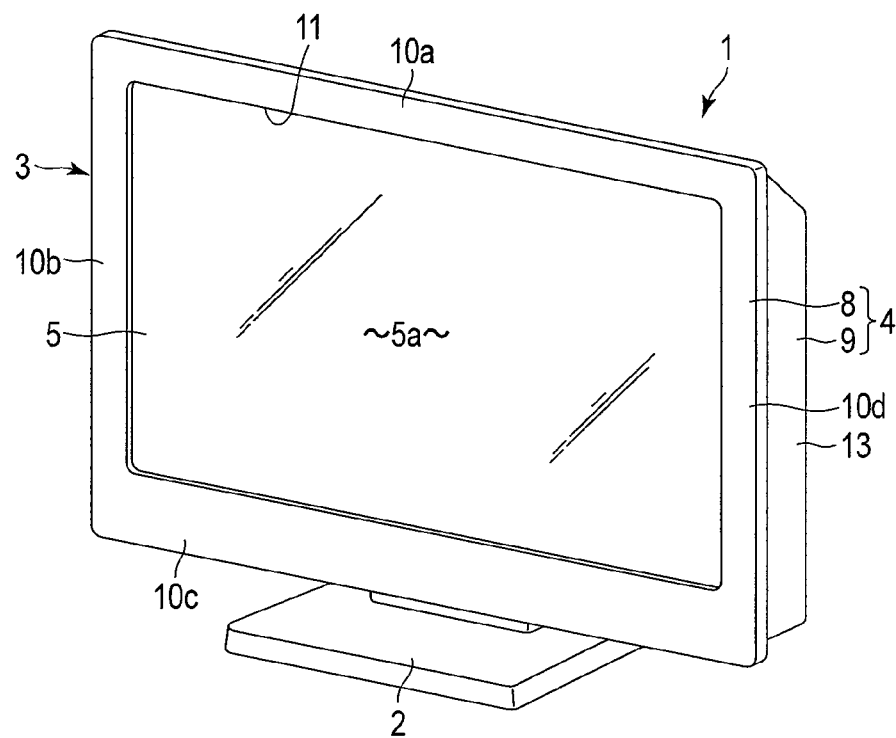
FIG. 1 is an exemplary perspective view of a liquid crystal television according to a first embodiment, as viewed from the front.
Figure 2:
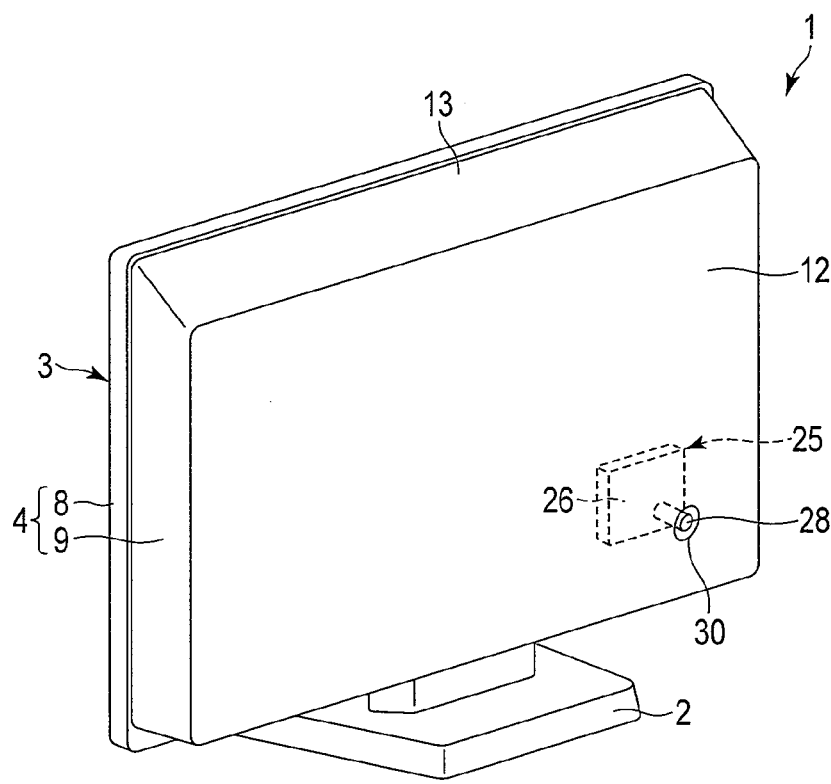
FIG. 2 is an exemplary perspective view of the liquid crystal television according to the first embodiment, as viewed from the rear.
Figure 3:
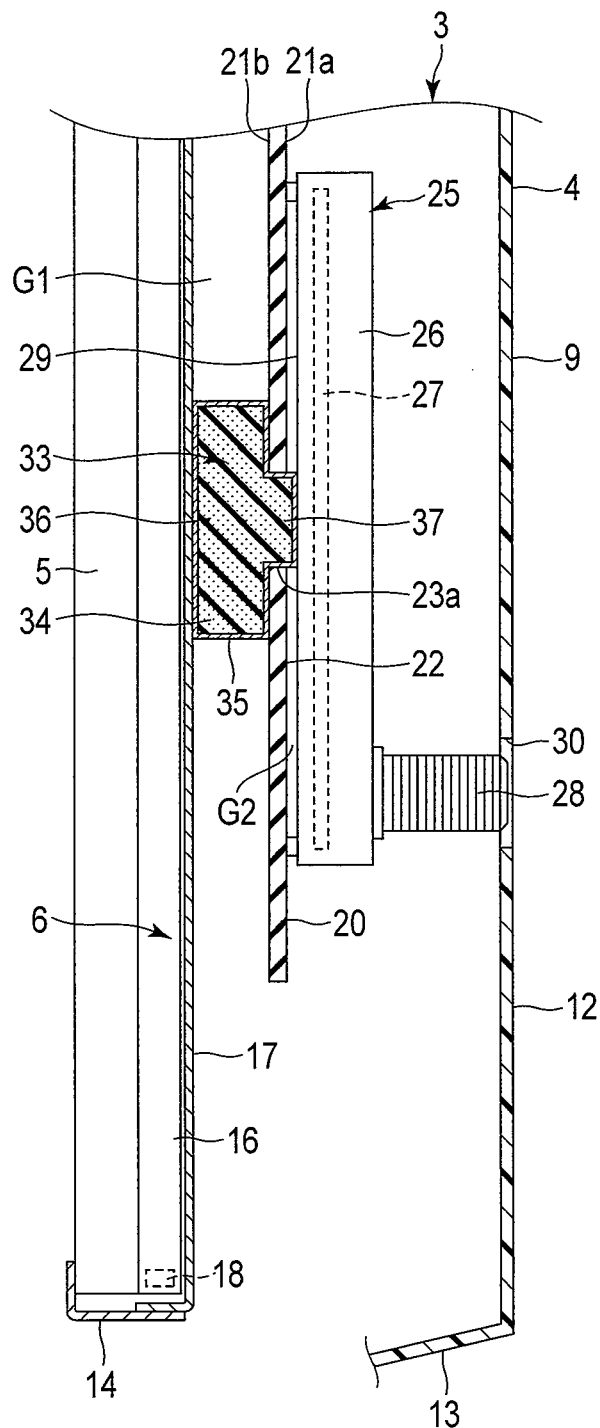
FIG. 3 is an exemplary cross-sectional view illustrating a state in which a tuner module mounted on a TV substrate is electrically connected to a radiator plate of a backlight module with a grounding gasket, in the first embodiment.

FIG. 1 to FIG. 3 disclose a liquid crystal television 1, which is an example of the electronic apparatus. The liquid crystal television 1 comprises a desk stand 2 and a television main body 3. The desk stand 2 is put on, for example, a top plate of a television rack. The television main body 3 is supported by the desk stand 2 such that the television main body 3 stands almost vertically on the top plate.

The television main body 3 includes a housing 4, a liquid crystal panel 5, and a backlight module 6. The housing 4 has, for example, a flat and square box shape. The housing 4 includes a front bezel 8 and a back bezel 9. The front bezel 8 and the back bezel 9 are formed of synthetic resin material such as ABS resin.

The front bezel 8 forms the front wall of the housing 4. The front bezel 8 is a rectangular frame, which includes first to fourth edge parts 10a, 10b, 10c, and 10d. The first to fourth edge parts 10a, 10b, 10c, and 10d define a rectangular opening part 11 in cooperation with each other. The opening part 11 stands almost vertically to face the viewer.

The back bezel 9 is combined with the front bezel 8, to cover the front bezel 8 from the rear. The back bezel 9 includes a rear wall 12 and a peripheral wall 13. The rear wall 12 stands behind the opening part 11 of the front bezel 8. The peripheral wall 13 continues in a circumferential direction of the rear wall 12, and projects from the outer peripheral edge of the rear wall 12 toward the front bezel 8. A distal end of the peripheral wall 13 abuts against the outer peripheral edge part of the front bezel 8.

The liquid crystal panel 5 is contained inside the housing 4. The liquid crystal panel 5 is a flat rectangular plate which is formed by stacking a panel main body that includes a liquid crystal layer and a driving substrate, a polarizing plate, and a protective sheet. An outer peripheral edge part of the liquid crystal panel 5 is surrounded with a metal frame 14.

The liquid crystal panel 5 stands inside the housing 4, such that the liquid crystal panel 5 extends along the rear wall 12 of the back bezel 9. The liquid crystal panel 5 includes a screen 5a that displays images. The screen 5a is exposed to the outside of the housing 4 through the opening part 11 of the front bezel 8.

As illustrated in FIG. 3, the backlight module 6 is placed behind the liquid crystal panel 5. The backlight module 6 includes a light-guide plate 16, and a radiator plate 17. The light-guide plate 16 is a rectangular plate, which has a size equal to that of the panel main body of the liquid crystal panel 5, and is opposed to the back surface of the liquid crystal panel 5.

A light source 18 is disposed in a lower end part of the light-guide plate 16. The light source 18 includes, for example, a plurality of light-emitting diodes. The light-emitting diodes are arranged at intervals in a line in a width direction of the light-guide plate 16. Light which is emitted from the light source 18 is made incident on the light-guide plate 16 from the lower end of the light-guide plate 16. The light which has been made incident on the light-guide plate 16 is transmitted through the light-guide plate 16, and goes toward the liquid crystal panel 5. Therefore, light is radiated from the light-guide plate 16 toward the liquid crystal panel 5, and visibility of images displayed on the screen 5a of the liquid crystal panel 5 is improved.

The radiator plate 17 of the backlight module 6 is an example of the ground part, and formed of metal material such as aluminum. The radiator plate 17 is coupled with the frame 14 that surrounds the liquid crystal panel 5, and covers the whole light-guide plate 16 and the whole light source 18 from behind.

As illustrated in FIG. 3 to FIG. 5, a TV substrate 20 is disposed behind the radiator plate 17. The TV substrate 20 stands between the radiator plate 17 and the rear wall 12 of the back bezel 9, such that the TV substrate 20 extends along the radiator plate 17. The TV substrate 20 includes a first mounting surface 21a and a second mounting surface 21b. The first mounting surface 21a faces the rear wall 12 of the back bezel 9 in the housing 4. The second mounting surface 21b is positioned opposite to the first mounting surface 21a in a thickness direction of the TV substrate 20. The second mounting surface 21b faces the radiator plate 17 in the housing 4. A first gap G1 is formed between the radiator plate 17 and the TV substrate 20.

As illustrated with a two-dot chain line in FIG. 5, a tuner mounting region 22 is defined on the first mounting surface 21a of the TV substrate 20. The tuner mounting region 22 has, for example, a rectangular shape, and is located in a lower part of the TV substrate 20. In addition, a pair of through-holes 23a and 23b are formed in the tuner mounting region 22 of the TV substrate 20. Each of through-holes 23a and 23b has a rectangular opening shape, and they are apart from each other in a height direction of the TV substrate 20.

Specifically, each of through-holes 23a and 23b has a rectangular shape, which has long sides L and short sides S. The long sides L extend in a width direction (horizontal direction) of the TV substrate 20. The short sides S extend in the height direction (vertical direction) of the TV substrate 20. Through-holes 23a and 23b are opened in the first mounting surface 21a and the second mounting surface 21b of the TV substrate 20, and face the radiator plate 17.

Figure 6:
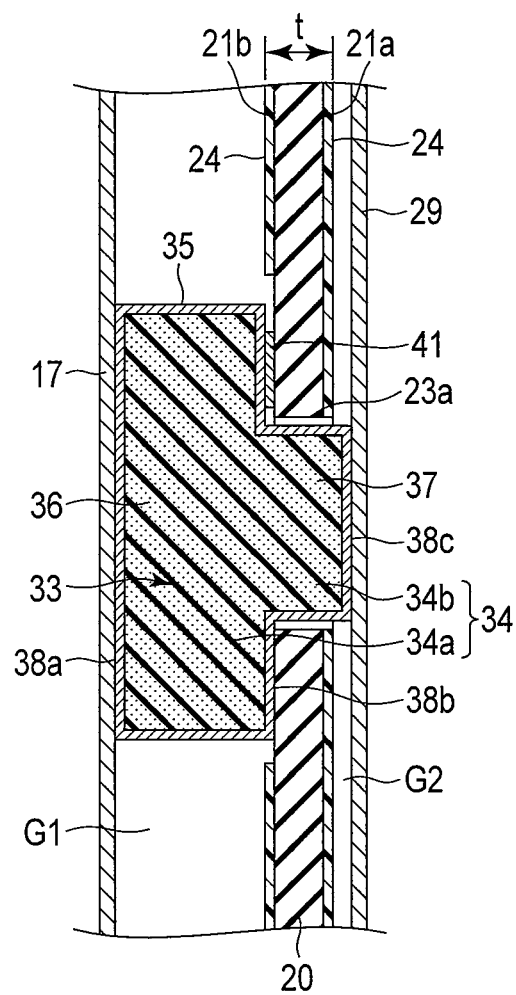
FIG. 6 is an exemplary cross-sectional view illustrating a state in which a grounding gasket is interposed between the radiator plate and the tuner module, in the first embodiment.

In addition, as illustrated in FIG. 6, the first mounting surface 21a and the second mounting surface 21b of the TV substrate 20 are covered with respective resist layers 24. The resist layer 24 that coats the second mounting surface 21b is removed over a certain range from the second mounting surface 21b, in parts which correspond to through-holes 23a and 23b.

In other words, conductor patterns of the TV substrate 20 are maintained in an exposed state, in parts of the second mounting surface 21b that correspond to through-holes 23a and 23b. In addition, the conductor patterns are covered with an insulating layer of the TV substrate 20 so as not to be exposed to the insides of through-holes 23a and 23b.

As illustrated in FIG. 3 to FIG. 5, a tuner module 25 is mounted on the tuner mounting region 22 of the TV substrate 20 by soldering or the like. The tuner module 25 is an example of the conductive component. The tuner module 25 covers through-holes 23a and 23b of the TV substrate 20 from a side opposite to a side on which the radiator plate 17 is located.

The tuner module 25 includes a shield case 26, a circuit board 27, and a coaxial connector 28. The shield case 26 has a rectangular box shape. The shield case 26 is formed of metal material, which has a function of blocking undesired radio emissions such as spurious. The shield case 26 includes a flat bottom plate 29. The bottom plate 29 faces the tuner mounting region 22 and through-holes 23a and 23b of the TV substrate 20.

In the first embodiment, a second gap G2 is secured between the bottom plate 29 the tuner mounting region 22 of the TV substrate 20. The second gap G2 is narrower than the first gap G1.

The circuit board 27 is contained in the shield case 26. The circuit board 27 is equipped with a plurality of tuners that receive a plurality of terrestrial digital television broadcasting signals. The tuners are covered with the shield case 26, and adjacent to each other in the shield case 26.

The coaxial connector 28 is a component, to which an antenna cable is detachably connected. The coaxial connector 28 is electrically connected to the circuit board 27, and projects from the shield case 26 toward the rear wall 12 of the back bezel 9. A distal end of the coaxial connector 28 is exposed to the outside of the housing 4 through a cable inserting port 30 that is opened in the rear wall 12.

In the liquid crystal television 1 according to the first embodiment, a pair of grounding gaskets 33 (hereinafter referred to as "gaskets") are interposed between the radiator plate 17, which serves as the ground part, and the TV substrate 20, to strengthen measures against spurious for the tuner module 25 that contains the tuners. The gaskets 33 are products serving as measures against noise, which suppress rapid change in impedance.

Figure 7A:
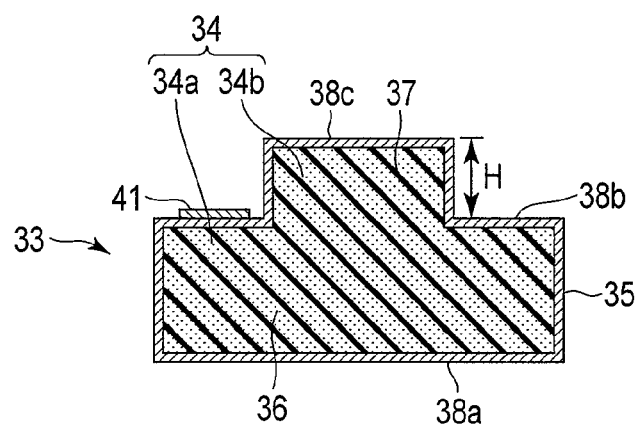
FIG. 7A is an exemplary cross-sectional view of the grounding gasket used in the first embodiment.
Figure 7B:
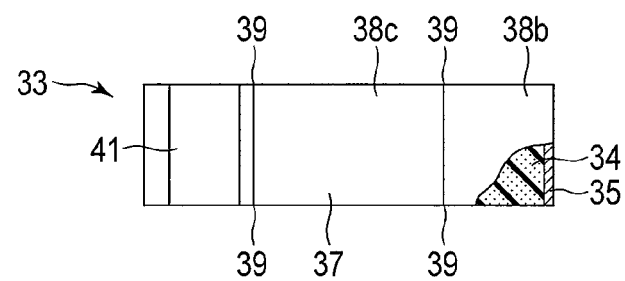
FIG. 7B is an exemplary plan view of the grounding gasket used in the first embodiment.

As illustrated in FIG. 6, FIG. 7A, and FIG. 7B, each gasket 33 includes a core member 34 and a conductive layer 35. The core member 34 is an element which determines a basic shape of the gasket 33. The core member 34 is formed of foam material, which is formed of polyurethane in a sponge form, and has elasticity. The conductive layer 35 is formed of soft conductive cloth which is obtained by subjecting fiber cloth to metal plating. The conductive layer 35 is bonded to an outer peripheral surface of the core member 34, and covers the core member 34.

Each gasket 33 includes a main body 36 and a projecting part 37. The main body 36 is an element which is disposed in the first gap G1 between the radiator plate 17 and the TV substrate 20. The main body 36 is formed to have a rectangular parallelepiped shape, which has long sides E1 and short sides E2. The long sides E1 extend in the width direction (horizontal direction) of the TV substrate 20. The short sides E2 extend in the height direction (vertical direction) of the TV substrate 20.

In addition, the main body 36 includes a first surface 38a that contacts the radiator plate 17, and a second surface 38b that contacts the second mounting surface 21b of the TV substrate 20. The first surface 38a and the second surface 38b are arranged in parallel with each other.

The projecting part 37 projects from a center part of the second surface 38b of the main body 36. The projecting part 37 is an element which is individually inserted into through-hole 23a or 23b of the TV substrate 20. The projecting part 37 is formed in a rectangular parallelepiped shape which agrees with the shape of the opening of through-holes 23a and 23b. Therefore, the projecting part 37 has four corners 39 that are engaged with the four corners of through-hole 23a or 23b.

A projection height H of the projecting part 37 is larger than a thickness t of the TV substrate 20, when the gaskets 33 are in a free state. Therefore, the projecting part 37 is configured to extend through through-hole 23a or 23b, and projects from the first mounting surface 21a of the TV substrate 20.

The projecting part 37 also has a third surface 38c that contacts the bottom plate 29 of the shield case 26. The third surface 38c is located at a projecting end of the projecting part 37.

According to the first embodiment, the core member 34 of each gasket 33 includes a first part 34a, which defines the shape of the main body 36, and a second part 34b, which defines the shape of the projecting part 37, and the first part and the second part are formed as one unitary piece. The conductive layer 35 continuously surrounds the first and second parts 34a and 34b. Therefore, the projecting part 37 is united with the main body 36.

As illustrated in FIG. 7A and FIG. 7B, a double-sided tape 41, which has conductivity, is adhered to the second surface 38b of the main body 36. The double-sided tape 41 is an example of an adhesive layer which temporarily fixes the gaskets 33 to the TV substrate 20. The double-sided tape 41 is adjacent to the projecting part 37.

Next, a process of interposing the gaskets 33 between the radiator plate 17 and the tuner module 25 will be explained hereinafter.

First, the tuner module 25 is soldered onto the first mounting surface 21a of the TV substrate 20, together with other circuit components. Next, the gaskets 33 are held with the hand, and the projecting parts 37 of the gaskets 33 are inserted into through-holes 23a and 23b of the TV substrate 20 from the second mounting surface 21b of the TV substrate 20.

Since the projection height H of the projecting part 37 is larger than the thickness t of the TV substrate 20, the third surfaces 38c of the projecting parts 37 enter the second gap G2, and contact the bottom plate 29 of the shield case 26.

When the projecting parts 37 are inserted into through-holes 23a and 23b, the outer peripheral surfaces of the projecting parts 37 may be separated from through-holes 23a and 23b, or contact through-holes 23a and 23b.

When the projecting parts 37 of the gaskets 33 are inserted into through-holes 23a and 23b of the TV substrate 20, each double-sided tape 41 is interposed between the second surface 38b of the main body 36 and the second mounting surface 21b of the TV substrate 20. Therefore, each main body 36 is temporarily held by the TV substrate 20 through the double-sided tape 41. Therefore, even when the worker separates one's hand from the gaskets 33, the gaskets 33 do not fall out of the TV substrate 20.

Then, the TV substrate 20 is fixed above the radiator plate 17, such that the second mounting surface 21b of the TV substrate 20 is opposed to the radiator plate 17. By the fixing, the main body 36 of each gasket 33 is held between the TV substrate 20 and the radiator plate 17.

Therefore, the main body 36 of each gasket 33 is compressed, and the first surface 38a of the main body 36 is elastically pushed against the radiator plate 17. In addition, the second surface 38b of each main body 36 is elastically pushed against part of the second mounting surface 21b of the TV substrate 20, from which the resist layer 24 has been removed. In addition, the projecting part 37 of each gasket 33 is compressed, together with the main body 36, and the third surface 38c of the projecting part 37 is elastically pushed against the bottom wall 29 of the shield case 26.

According to the first embodiment, each gasket 33 contacts the three components, that is, the radiator plate 17, the TV substrate 20, and the tuner module 25, at the first surface 38a, the second surface 38b, and the third surface 38c, respectively. Therefore, the radiator plate 17, the TV substrate 20, and the tuner module 25 are simultaneously maintained at an electrically-conducted state by one gasket 33.

Therefore, the shield case 26 of the tuner module 25 is directly electrically connected to the radiator plate 17 serving as ground part, and the impedance of the shield case 26 is increased. As a result, it is possible to securely prevent radio interference caused by spurious.

In addition, the projecting parts 37 of the gaskets 33 contact the shield case 26 of the tuner module 25, in a state where they extend through through-holes 23a and 23b of the TV substrate 20. Therefore, the gaskets 33 are engaged with the TV substrate 20, and maintained in fixed positions between the TV substrate 20 and the radiator plate 17.

As a result, the gaskets 33 are prevented from getting out of position or falling out of the positions between the radiator plate 17 and the TV substrate 20. It is thus possible to maintain good electrical connection between the tuner module 25 and the radiator plate 17 for a long period of time.

Besides, according to the first embodiment, the TV substrate 20 is provided with through-holes 23a and 23b, through which the projecting parts 37 of the gaskets 33 extend. In other words, through-holes 23a and 23b function as marks that indicate the positions in which the gaskets 33 are attached. Thus, the positions of the gaskets 33 with respect to the radiator plate 17, the TV substrate 20, and the tuner module 25 are determined, only by inserting the projecting parts 37 of the gaskets 33 into through-holes 23a and 23b.

Thus, the positions in which the gaskets 33 are attached do not vary, and the gaskets 33 can be attached in proper positions of each product with accuracy.

In addition, since through-holes 23a and 23b clarify the positions in which the gaskets 33 are attached, the gaskets 33 can easily be attached to the TV substrate 20 and the tuner module 25. Thus, it is possible to improve the manufacturing efficiency for the liquid crystal television 1.

Besides, each of through-holes 23a and 23b of the TV substrate 20 has a rectangular opening shape, and each of the projecting parts 37 of the gaskets 33 is formed in a rectangular parallelepiped shape that agrees with through-holes 23a and 23b. Thus, as illustrated best in FIG. 5, the projecting parts 37 should be just inserted into through-holes 23a and 23b such that the long sides E1 of them extend along the long sides L of through-holes 23a and 23b, and thereby the orientations of the gaskets 33 with respect to the TV substrate 20 can be fixed.

Thus, the worker is not confused about the direction of the gaskets 33, when the worker inserts the projecting parts 37 of the gaskets 33 into through-holes 23a and 23b of the TV substrate 20. This structure is convenient for easily attaching the gaskets 33.

The number of gaskets that electrically connect the tuner module with the radiator plate is not limited to the number in the first embodiment. For example, one gasket or three or more gaskets may be used to electrically connect the tuner module with the radiator plate.

Second Embodiment

Figure 8A:
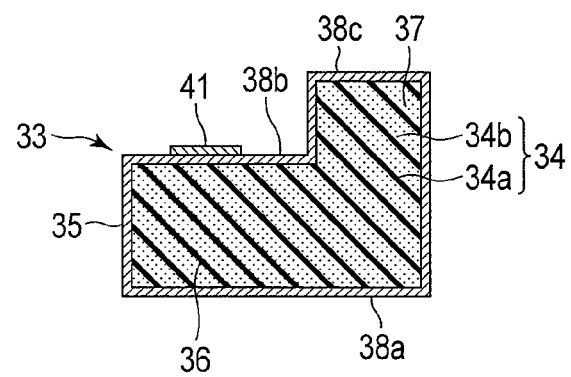
FIG. 8A is an exemplary cross-sectional view of a grounding gasket used in a second embodiment.
Figure 8B:
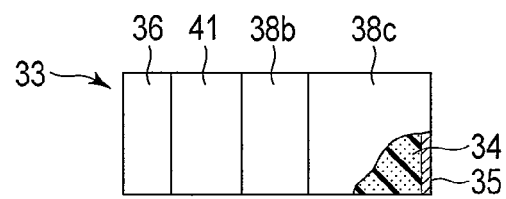
FIG. 8B is an exemplary plan view of the grounding gasket used in the second embodiment.
Figure 9:
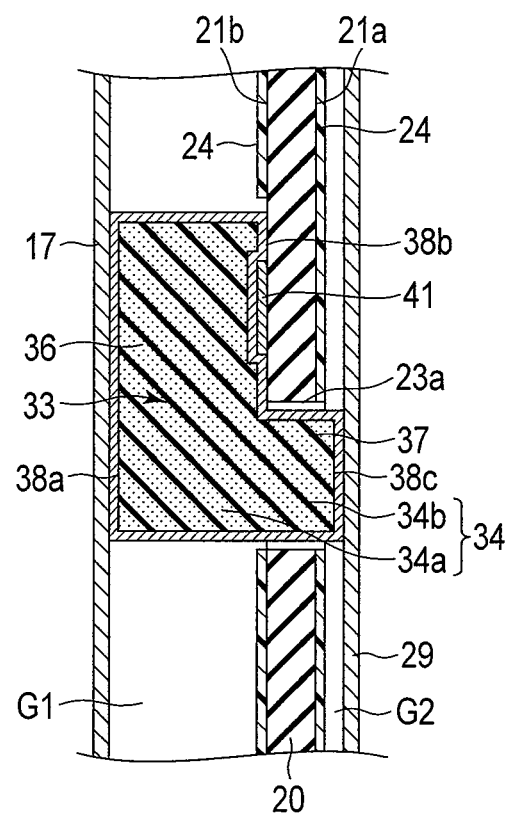
FIG. 9 is an exemplary cross-sectional view illustrating a state in which the grounding gasket is interposed between a radiator plate and a tuner module, in the second embodiment.

FIG. 8A, FIG. 8B and FIG. 9 disclose a second embodiment.

The second embodiment is different from the first embodiment in the shape of the grounding gaskets 33. The other structures of the radiator plate 17 and the shield case 26 in the second embodiment are the same as those in the first embodiment. Thus, in the second embodiment, the same constituent elements of the second embodiment as those of the first embodiment are denoted by the same respective reference numerals, and explanation thereof is omitted.

As illustrated in FIG. 8, in each gasket 33 according to the second embodiment, a projecting part 37 projects as one unitary piece from an end part of a second surface 38b of a main body 36. In other words, the projecting part 37 is provided in a position displaced from the longitudinal center of the main body 36.

When the main body 36 of each gasket 33 is held between a TV substrate 20 and a radiator plate 17, the main body 36 is compressed, and a first surface 38a of the main body 36 is elastically pushed against the radiator plate 17. Besides, the second surface 38b of the main body 36 is elastically pushed against part of a second mounting surface 21b of the TV substrate 20, from which a resist layer 24 has been removed. In addition, the projecting part 37 of each gasket 33 is compressed together with the main body 36, and a third surface 38c of the projecting part 37 is elastically pushed against a bottom plate 29 of the shield case 26.

Therefore, each gasket 33 contacts the three elements, that is, the radiator plate 17, the TV substrate 20, and a tuner module 25, at the first surface 38a, the second surface 38b, and the third surface 38c, respectively. Thereby, the radiator plate 17, the TV substrate 20, and the tuner module 25 are simultaneously maintained in an electrically connected state by one gasket 33.

Therefore, the gasket 33 according to the second embodiment can achieve the same effect as that of the first embodiment.

Third Embodiment

FIG. 10A, FIG. 10B, FIG. 11, and FIG. 12 disclose a third embodiment.

The third embodiment is different from the first embodiment in the shape of grounding gaskets 51. The other structures of the radiator plate 17 and the shield case 26 are the same as those of the first embodiment. Thus, in the third embodiment, constituent elements which are the same as those in the first embodiment are denoted by the same respective reference numerals, and explanation thereof is omitted.

Figure 10A:
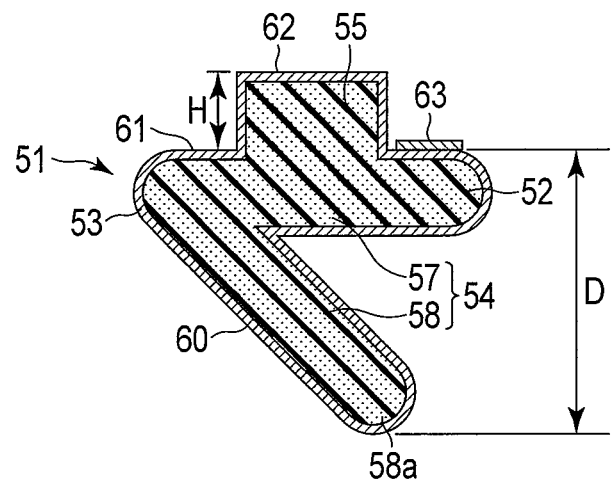
FIG. 10A is an exemplary cross-sectional view of a grounding gasket used in a third embodiment.
Figure 10B:
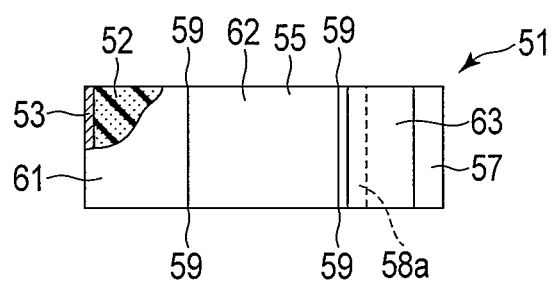
FIG. 10B is an exemplary plan view of the grounding gasket used in the third embodiment.

As illustrated in FIG. 10A and FIG. 10B, each gasket 51 includes a core member 52 and a conductive layer 53. The core member 52 is an element which defines the basic shape of the gasket 51. The core member 52 is formed of foam material, which is formed of polyurethane in a sponge form, and has elasticity. The conductive layer 53 is formed of soft conductive cloth which is obtained by subjecting fiber cloth to metal plating. The conductive layer 53 is bonded to an outer peripheral surface of the core member 52, and covers the core member 52.

Each gasket 51 includes a main body 54 and a projecting part 55. The main body 54 is an element which is disposed in a first gap G1 located between a radiator plate 17 and a TV substrate 20. The main body 54 includes a base part 57 and a leg part 58.

The base part 57 is formed to have, for example, a rectangular plate shape. The leg part 58 is formed as one unitary piece at a longitudinal end of the base part 57. The leg part 58 extends in an inclined direction from the end of the base part 57 to be opposed to the base part 57. Therefore, the leg part 58 is capable of elastically changing its shape in a direction of going close to or away from the base part 57.

The main body 54 having the above structure includes a first surface 60 and a second surface 61. The first surface 60 extends between a distal end 58a of the leg part 58a and the end of the base part 57, and is inclined with respect to the base part 57. The second surface 61 is formed on the base part 57. Therefore, when the gasket 51 is in a free state, the first surface 60 is inclined with respect to the second surface 61.

The projecting part 55 projects from a center part of the second surface 61 of the main body 54. The projecting part 55 is an element which is individually inserted into a through-hole 23a or 23b of the TV substrate 20. The projecting part 55 is formed in a rectangular parallelepiped shape which agrees with the shape of the openings of through-holes 23a and 23b. Thus, the projecting part 55 has four corners 59 which are engaged with four corners of one of through-holes 23a and 23b.

A projection height H of the projecting part 55 is larger than a thickness t of the TV substrate 20, when the gasket 51 is in a free state. Thus, the projecting part 55 is configured to extend through through-hole 23a or 23b, and project from the first mounting surface 21a of the TV substrate 20.

The projecting part 55 also includes a third surface 62 which contacts a bottom plate 29 of a shield case 26. The third surface 62 is located at a projecting end of the projecting part 55.

A double-sided tape 63, which has conductivity, is adhered to the second surface 61 of the main body 54. The double-sided tape 63 is an example of an adhesive layer that temporarily fixes the gaskets 51 to the TV substrate 20. The double-sided tape 63 is adjacent to the projecting part 55.

Figure 11:
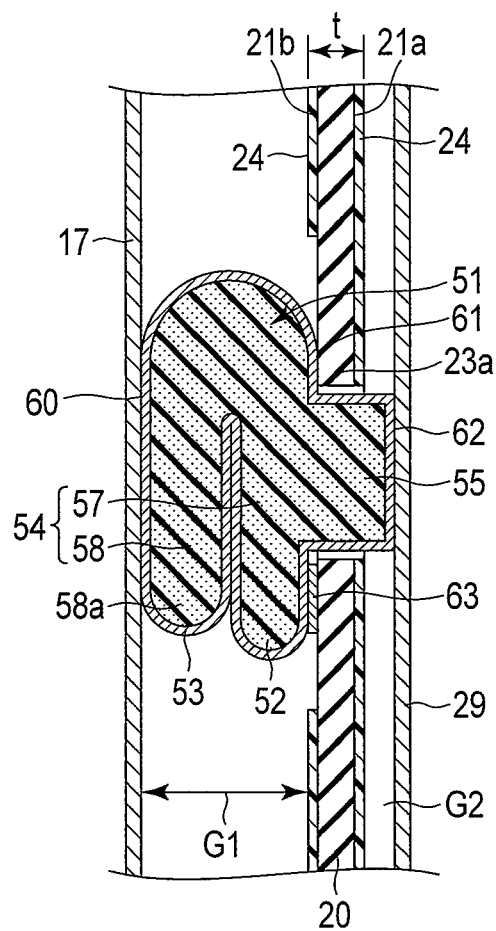
FIG. 11 is an exemplary cross-sectional view illustrating a state in which the grounding gasket is interposed between a radiator plate and a tuner module, in the third embodiment.

When a gap G1 between the radiator plate 17 and a second mounting surface 21b of the TV substrate 20 is smaller than a size D from the distal end 58a of the leg part 58 to the second surface 61 of the base part 57 in a free state of the gasket 51, the shape of each gasket 51 is changed as illustrated in FIG. 11.

Specifically, when the TV substrate 20, on which the gaskets 51 are temporarily fixed, is fixed above the radiator plate 17, the leg part 58 of each gasket 51 is pressed to be brought closer to the base part 57, as a result of contact with the radiator plate 17. Thereby, the leg part 58 is superposed on the base part 57, and the main body 54 that includes the base part 57 and the leg part 58 is held between the TV substrate 20 and the radiator plate 17.

Thus, the main body 54 is compressed, and the first surface 60 of the leg part 58 is elastically pushed against the radiator plate 17. In addition, the second surface 61 of the base part 57 is elastically pushed against part of the second mounting surface 21b of the TV substrate 20, from which a resist layer 24 has been removed. Besides, the projecting part 55 of each gasket 55 is compressed together with the main body 54, and the third surface 62 of the projecting part 55 is elastically pushed against the bottom plate 29 of the shield case 26.

As a result, each gasket 51 contacts the three elements, that is, the radiator plate 17, the TV substrate 20, and a tuner module 25, at the first surface 60, the second surface 61, and the third surface 62, respectively. Thereby, the radiator plate 17, the TV substrate 20, and the tuner module 25 are simultaneously maintained in an electrically connected state by one gasket 51.

On the other hand, when the gap G1 is larger than that illustrated in FIG. 11, the shape of each gasket 51 is changed as illustrated in FIG. 12. In the example illustrated in FIG. 12, change in position of the leg part 58 is reduced, as the gap G1 has an increased size. Thus, the first surface 60 of the leg part 58 is separated from the radiator plate 17. In addition, as the position of the leg part 58 is changed, the base part 57 is pressed toward the TV substrate 20, and the second surface 61 of the base part 57 is elastically pushed against part of the second mounting surface 21b of the TV substrate 20, from which the resist layer 24 has been removed. Besides, the projecting part 55 of each gasket 51 is compressed as the position of the leg part 58 is changed, and the third surface 62 of the projecting part 55 is elastically pushed against the bottom plate 29 of the shield case 26.

As a result, each gasket 51 contacts the three elements, that is, the radiator plate 17, the TV substrate 20, and the tuner module 25, at the distal end 58a of the leg part 58, the second surface 61, and the third surface 62, respectively. Thereby, the radiator plate 17, the TV substrate 20, and the tuner module 25 are simultaneously maintained in an electrically connected state by one gasket 33.

The gasket 51 according to the third embodiment includes the leg part 58 which can be elastically dislocated in a direction of going close to or away from the base part 57, from which the projecting part 55 projects. Therefore, even when the size of the first gap G1 varies according to, for example, the size of the liquid crystal television 1 or the type of the television, the position of the leg part 58 is elastically changed according to the size of the first gap G1.

Therefore, gaskets 51 of one type are compliant with various liquid crystal televisions, which have different sizes of the first gap G1 between the radiator plate 17 and the TV substrate 20. It is thus unnecessary to prepare a plurality of types of gaskets which correspond to respective sizes of the first gap G1, and the gaskets 51 can be used as common parts.

In addition, also in the gaskets 51 according to the third embodiment, the projecting part 55 which projects from the base part 57 extends through through-hole 23a or 23b of the TV substrate 20. So, the gaskets 51 should just be attached to the TV substrate 20, with through-holes 23a and 23b used as marks, and thus the third embodiment can achieve the same effect as that of the first embodiment.

Fourth Embodiment

FIG. 13 discloses a fourth embodiment.

The fourth embodiment is different from the first embodiment, in that a core member 34 of each grounding gasket 33 is divided into two, that is, a first part 34a which determines the shape of a main body 36, and a second part 34b which determines the shape of a projecting part 37. The structure of the other parts of the gasket 33 is the same as that of the first embodiment. Thus, in the fourth embodiment, constituent elements which are the same as those in the first embodiment are denoted by the same respective reference numerals, and explanation thereof is omitted.

As illustrated in FIG. 13, the first part 34a and the second part 34b of the core member 34 are formed of different foam materials, which have different modulus of elasticity. In the fourth embodiment, the modulus of elasticity of the foam material that forms the second part 34b is less than the modulus of elasticity of the foam material that forms the first part 34a. In other words, the projecting part 37 is more flexible than the main body 36.

The second part 34b of the core member 34 is adhered to the first part 34a with a double-sided tape 71 which has conductivity. Therefore, the first part 34a and the second part 34b are maintained in a state of being electrically connected to each other.

In addition, a conductive layer 35 continuously surrounds the first part 34a and the second part 34b, and thereby encloses the first part 34a and the second part 34b as one unitary piece.

According to the fourth embodiment, the projecting part 37 of each gasket 33 is more flexible than the main body 36. Therefore, when a third surface 38c of the projecting part 37 contacts a bottom plate 29 of a shield case 26, the shape of the third surface 38c is smoothly changed to extend along the bottom plate 29.

Specifically, even when the bottom plate 29 is partly curved or has projections and depressions, the shape of the third surface 38c of the projecting part 37 is changed to follow the shape of the bottom plate 29. Therefore, the third surface 38c of the projecting part 37 is brought into close contact with the bottom plate 29 without space therebetween. Thus, the contact area between the gasket 33 and the shield case 26 is sufficiently secured, and it is possible to securely prevent radio interference mainly caused by spurious.

Although the projecting part 37 is configured to be more flexible than the main body 36 in the fourth embodiment, for example, the projecting part 37 may be configured to be less flexible than the main body 36, by setting the modulus of elasticity of the foam material that forms the second part 34b higher than the modulus of elasticity of the foam material that forms the first part 34a.

Fifth Embodiment

Figure 15:
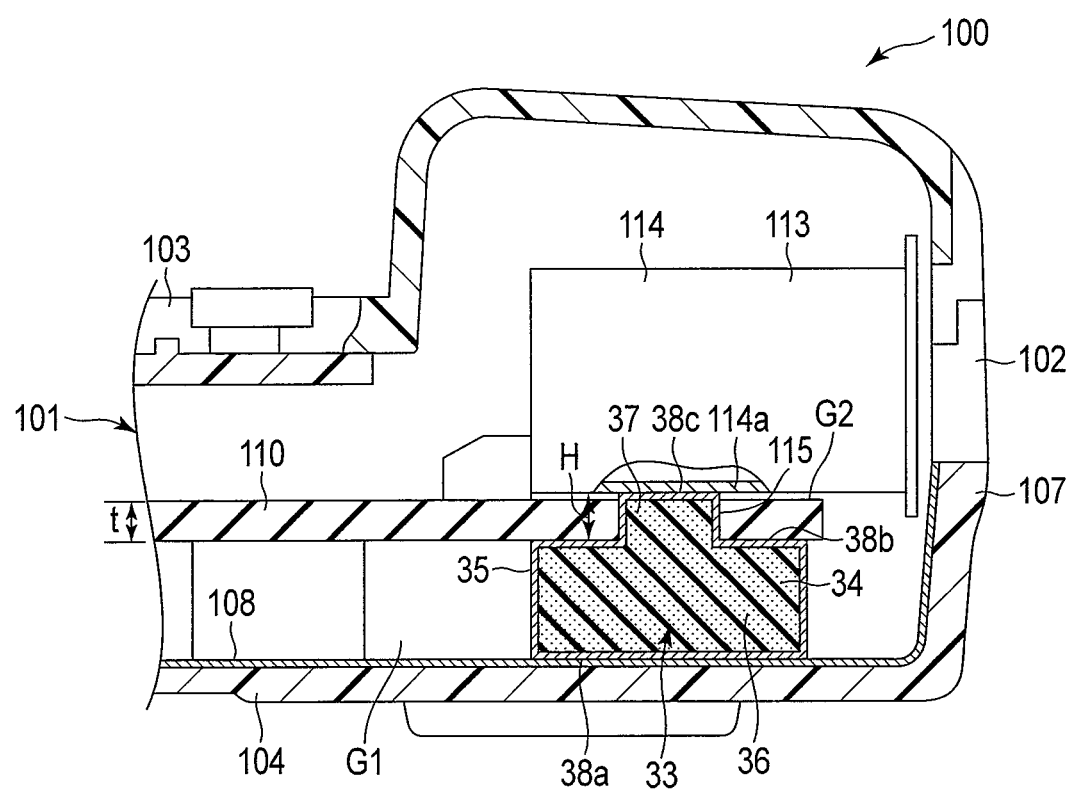
FIG. 15 is an exemplary cross-sectional view of the portable computer, illustrating a state in which a grounding gasket is interposed between a housing and a connector mounted on a printed circuit board in the fifth embodiment.

FIG. 14 and FIG. 15 disclose a fifth embodiment.

The fifth embodiment is obtained by applying the grounding gaskets 33 disclosed in the first embodiment to a portable computer 100, which is another example of the electronic apparatus. The structure of the gaskets 33 is basically the same as that of the first embodiment.

As illustrated in FIG. 14, the portable computer 100 comprises a main body 101 and a display 102. The main body 101 includes a first housing 103. The first housing 103 has a flat box shape that includes a bottom wall 104, an upper wall 105, side walls 106, and a rear wall 107. The first housing 103 is formed of, for example, synthetic resin. In the fifth embodiment, an internal surface of the first housing 103 is covered with a plating layer 108, and thereby the first housing 103 is provided with conductivity. Thus, the first housing 103 also serves as the ground part.

As illustrated in FIG. 15, the first housing 103 contains a motherboard 110, on which a CPU is mounted. The motherboard 110 is an example of the substrate. The motherboard 110 is supported on the bottom wall 104 of the first housing 103, such that the motherboard 110 is parallel with the bottom wall 104. A first gap G1 is formed between the motherboard 110 and the bottom wall 104.

A plurality of connectors 111 are mounted on a rear-end part of an upper surface of the motherboard 110. The connectors 111 are arranged at intervals in a line in a width direction of the first housing 103, and exposed to the outside of the first housing 103 through a plurality of opening parts 112 which are opened in the rear wall 107.

The connector 111 includes a USB connector 113 as illustrated in FIG. 15. The USB connector 113 is an example of the conductive component. An outer peripheral surface of the USB connector 113 is covered with a metal case 114. The case 114 includes a bottom plate 114a which contacts the upper surface of the motherboard 110. A second gap G2 is formed between the bottom plate 114a and the motherboard 110. The second gap G2 is narrower than the first gap G1.

The motherboard 110 also includes a through-hole 115. The through-hole 115 pierces the motherboard 110 in a thickness direction and in a position corresponding to the USB connector 113, and is opposed to the plating layer 108 that covers the bottom wall 104. Thus, the USB connector 113 covers the through-hole 115 of the motherboard 110 from a side opposite to a side on which the plating layer 108 superposed on the bottom wall 104 is located.

The display 102 includes a second housing 117 which contains a liquid crystal panel. The second housing 117 includes a pair of leg parts 118a and 118b. The leg parts 118a and 118b are rotatably supported by hinges on the rear end part of the first housing 103.

As illustrated in FIG. 15, a grounding gasket 33 is interposed between the bottom wall 104 of the first housing 103 and the motherboard 110. A main body 36 of the gasket 33 is disposed in a first gap G1 between the bottom wall 104 and the motherboard 110. A first surface 38a of the main body 36 elastically contacts the plating layer 108 superposed on the bottom wall 104. A second surface 38b of the main body 36 elastically contacts the motherboard 110.

A projecting part 37 is inserted into the through-hole 115 of the motherboard 110. A projection height H of the projecting part 37 is larger than a thickness t of the motherboard 110, when the gasket 33 is in a free state. Therefore, the projecting part 37 is configured to extend through the through-hole 115 and project into a gap G2 between the motherboard 110 and the USB connector 113. In addition, a third surface 38c of the projecting part 37 elastically contacts the bottom plate 114a of the case 114 of the USB connector 113.

Next, process of interposing the gasket 33 between the bottom wall 104 of the first housing 103 and the USB connector 113 will be explained hereinafter.

First, the USB connector 113 is soldered onto the motherboard 110 together with other circuit components. Next, the gasket 33 is held by the hand, and the projecting part 37 of the gasket 33 is inserted into the through-hole 115 of the motherboard 110. Since the projection height H of the projecting part 37 is larger than the thickness t of the motherboard 110, the third surface 38c of the projecting part 37 enters the second gap G2, and abuts against the bottom plate 114a of the case 114 of the USB connector 113.

Then, the motherboard 110 is fixed above the bottom wall 104, such that a lower surface of the motherboard 110 is opposed to the bottom wall 104 of the first housing 103. By the fixing, the main body 36 of the gasket 33 is held between the motherboard 110 and the bottom wall 104.

Thus, the main body 36 is compressed, and the first surface 38a of the main body 36 is elastically pushed against the plating layer 108 superposed on the bottom wall 104. In addition, the second surface 38b of the main body 36 is elastically pushed against the lower surface of the motherboard 110. Besides, the projecting part 37 of the gasket 33 is compressed together with the main body 36, and the third surface 38c of the projecting part 37 is elastically pushed against the bottom plate 114a of the case 114 of the USB connector 113.

As a result, the gasket 33 contacts the three elements, that is, the first housing 103 serving as the ground part, the motherboard 110, and the USB connector 113, at the first surface 38a, the second surface 38b, and the third surface 38c, respectively. Thereby, the first housing 103, the motherboard 110, and the USB connector 113 are simultaneously maintained in an electrically connected state by one gasket 33.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A grounding gasket formed by covering an outer peripheral surface of a core member having elasticity with a conductive layer, comprising:
    a main body which is interposed between a ground part and a substrate, and contacts the ground part and the substrate; and
    a projecting part which projects from the main body, the projecting part being configured to extend through a through-hole that is opened in the substrate, project from a side opposite to a side on which the ground part is located, and contact a conductive component mounted on the substrate.

2. The grounding gasket of claim 1, wherein
    the main body includes a first surface which contacts the ground part, a second surface which contacts the substrate, and the projecting part projects from the second surface and includes a third surface which contacts the conductive component.

3. The grounding gasket of claim 1, further comprising:
    an adhesive layer which adheres the main body to the substrate.

4. The grounding gasket of claim 1, wherein
    the projecting part is united with the main body.

5. The grounding gasket of claim 1, wherein
    the main body and the projecting part are formed of separate components, and the projecting part is adhered to the main body.

6. The grounding gasket of claim 5, wherein
the projecting part has modulus of elasticity which is different from modulus of elasticity of the main body.
7. The grounding gasket of claim 6, wherein
the modulus of elasticity of the projecting part is smaller than the modulus of elasticity of the main body.
8. A grounding gasket formed by covering an outer peripheral surface of a core member having elasticity with a conductive layer, comprising:
a main body which is interposed between a ground part and a substrate, and contacts the ground part and the substrate; and
a projecting part which projects from the main body, the projecting part being configured to extend through a through-hole that is opened in the substrate, project from a side opposite to a side on which the ground part is located, and contact a conductive component mounted on the substrate,
wherein the main body includes a base part which contacts the substrate and includes the projecting part, and a leg part which extends as one unitary piece from an end of the base part toward the ground part, and is capable of being displaced in a direction of going close to and away from the base part.
9. The grounding gasket of claim 8, wherein
the projecting part is united with the base part of the main body.
10. The grounding gasket of claim 9, further comprising:
an adhesive layer which adheres the main body to the substrate.
11. The grounding gasket of claim 9, wherein
the projecting part includes a plurality of corners which are engaged with the through-hole of the substrate.
12. An electronic apparatus comprising:
a ground part;
a substrate which includes a through-hole that faces the ground part;
a conductive component which is mounted on the substrate, and covers the through-hole from a side opposite to a side on which the ground part is located; and
a grounding gasket which includes an elastic core member and a conductive layer that covers an outer peripheral surface of the core member, the grounding gasket being configured to electrically connect the ground part, the substrate, and the conductive component,
wherein the grounding gasket includes:
a main body which is interposed between the ground part and the substrate, and contacts the ground part and the substrate; and
a projecting part which projects from the main body, extends through the through-hole of the substrate, and contacts the conductive component.
13. The electronic apparatus of claim 12, wherein
the main body of the grounding gasket includes a first surface which contacts the ground part, a second surface which contacts the substrate, and the projecting part projects from the second surface and includes a third surface which contacts the conductive component.
14. The electronic apparatus of claim 13, wherein
the substrate is covered with a resist layer, and the resist layer is removed from part of the substrate, which corresponds to the second surface of the main body.
15. The electronic apparatus of claim 12, wherein
the through-hole of the substrate is a square hole, and the projecting part of the grounding gasket has a plurality of corners which are engaged with the through-hole.
16. The electronic apparatus of claim 12, wherein
the grounding gasket includes an adhesive layer which adheres the main body to the substrate.
17. The electronic apparatus of claim 16, wherein
the substrate, on which the conductive component is mounted, is fixed to the ground part, in a state where the main body of the grounding gasket is adhered to the substrate.
18. The electronic apparatus of claim 17, wherein
the grounding gasket is held between the ground part and the conductive component.

* * * * *